(12) United States Patent
Schumacher et al.

(10) Patent No.: US 7,836,386 B2
(45) Date of Patent: Nov. 16, 2010

(54) PHASE SHIFT ADJUSTING METHOD AND CIRCUIT

(75) Inventors: Otto Schumacher, Dachau (DE); Martin Maier, Diessen (DE); Thomas Hein, Munich (DE); Aaron John Nygren, Munich (DE)

(73) Assignee: Qimonda AG, Munich (DE)

( * ) Notice: Subject to any disclaimer, the term of this patent is extended or adjusted under 35 U.S.C. 154(b) by 1083 days.

(21) Appl. No.: 11/535,968

(22) Filed: Sep. 27, 2006

(65) Prior Publication Data

US 2008/0075156 A1    Mar. 27, 2008

(51) Int. Cl.
*G06F 11/00* (2006.01)
*H04L 12/43* (2006.01)

(52) U.S. Cl. ............... 714/798; 714/700; 714/797; 714/814

(58) Field of Classification Search .......... 714/700, 714/797, 798, 814
See application file for complete search history.

(56) References Cited

U.S. PATENT DOCUMENTS

| 3,244,804 | A | * | 4/1966 | Wittenberg | 178/3 |
|---|---|---|---|---|---|
| 3,665,173 | A | * | 5/1972 | Bouricius et al. | 714/11 |
| 4,024,498 | A | * | 5/1977 | McIntosh | 714/700 |
| 4,357,702 | A | * | 11/1982 | Chase et al. | 714/700 |
| 4,958,243 | A | * | 9/1990 | Chen et al. | 360/51 |
| 5,566,193 | A | * | 10/1996 | Cloonan | 714/802 |
| 6,088,829 | A | * | 7/2000 | Umemura et al. | 714/798 |
| 6,917,762 | B2 | * | 7/2005 | Kim | 398/158 |
| 7,404,115 | B2 | * | 7/2008 | Boudon et al. | 714/715 |
| 7,467,335 | B2 | * | 12/2008 | Otto et al. | 714/700 |
| 7,536,579 | B2 | * | 5/2009 | Haas et al. | 713/500 |

FOREIGN PATENT DOCUMENTS

| DE | 10148157 | 4/2003 |
|---|---|---|
| DE | 10238841 | 3/2004 |

* cited by examiner

*Primary Examiner*—Joseph D Torres
(74) *Attorney, Agent, or Firm*—Patterson & Sheridan, LLP

(57) ABSTRACT

Method and system of adjusting a first phase shift between a first data signal and a clock signal at a sending device. First and second test signals representing first and second test data, respectively, are transmitted to a receiving device. The test signals have respective phase shifts relative to the clock signal. An error detection code is calculated from first and second received data carried by the transmitted signals. The error detection code is transmitted from the receiving device to the sending device. An estimated first received data is calculated from the error detection code, wherein the estimated first received data are calculated under the assumption that the second received data are identical to the second test data. The first phase shift is adjusted on the basis of a comparison of the estimated first received data and the first test data.

13 Claims, 5 Drawing Sheets

FIG 1

LEGEND FOR FIGURES 2A, 2B AND 3

11 - FURTHER CIRCUIT
36 - CLOCK SIGNAL SOURCE
40, 41, 43 - SAMPLING CIRCUITS
50, 51, 53 - PHASE SHIFTING CIRCUITS
55 - INVERSE REDUNDANCY CHECK CALCULATING CIRCUIT
56 - CLOCK AND DATA RECOVERY CIRCUIT
57 - CYCLIC REDUNDANCY CHECK CIRCUIT
65 - REDUNDANCY CHECK CALCULATING CIRCUIT
75 - PHASE SHIFT ADJUSTING CIRCUIT
76 - FINITE STATE MACHINE
90, 91, 93 - FIRST SAMPLING CIRCUITS
95 - REDUNDANCY CHECK CALCULATING CIRCUIT
98 - CONTROL CIRCUIT
99 - SECOND SAMPLING CIRCUIT

PHASE SHIFT ADJUSTING METHOD AND CIRCUIT

BACKGROUND OF THE INVENTION

1. Field of the Invention

The present invention refers to methods of adjusting a phase shift between a data signal and a clock signal, and to devices providing an adjustment of a phase shift between a data signal and a clock signal.

2. Description of the Related Art

In graphics applications and in other applications the data rate of the exchange of data between a memory controller and a memory device is increased more and more. According to the GDDR5-standard, the data rate will be up to 4 Gbit/s/pin or even 5 Gbit/s/pin. With data rates like these, the timing of the signals relative to the clock is a serious challenge. Any unforeseen delay of a data signal or of a clock signal drastically increases the error rate in the data detection at the receiver.

An automatic adjustment mechanism could reduce the static mismatches between the propagation paths of each single data signal and a clock signal. Thereby, voltage and temperature dependent drifts could be compensated to a certain level. However, neither present nor already projected future DRAM standards provide any mechanism for returning information about the phase alignment at the receiving memory device to the memory controller.

One way to obtain information about the phase alignment at the receiving memory device consists in writing specific data patterns repeatedly to the memory device with different values of a phase shift between the sent data signal and the clock signal. For each value of the phase shift, the data pattern is then read from the memory device, transferred into the memory controller and compared with the originally sent data pattern. A data phase window with error free transmission is identified and an optimum write phase is chosen within this window.

However, the circuitry for this solution is quite complex, in particular the computations are time consuming and require special circuitry in the memory controller. Thereby the costs of production of the memory controller are increased. Furthermore, the described solution utilizes memory space of the memory device. Application data stored in this memory space needs to be swapped to another memory space and restored afterwards.

SUMMARY OF THE INVENTION

The present invention provides advantages for an improved method of adjusting a phase shift between a data signal and a clock signal, an improved memory controller and an improved memory device.

In one embodiment of the present invention, there is a method of adjusting a first phase shift between a first data signal and a clock signal at a sending device, the method comprising: transmitting a first test signal representing first test data from the sending device to a receiving device via a first data line and transmitting second test signals representing second test data from the sending device to the receiving device via second data lines, wherein there is a first phase shift between the first test signal and the clock signal, and wherein there are second phase shifts between the second test signals and the clock signal; receiving the first test signal at the receiving device thereby obtaining a first received signal and receiving the second test signals at the receiving device thereby obtaining second received signals; detecting first received data from the first received signal and second received data from the second received signal using a clock signal; calculating an error detection code from the first received data or from the first and second received data and transmitting the error detection code from the receiving device to the sending device; calculating estimated first received data from the error detection code, wherein the estimated first received data are calculated under the assumption that the second received data are identical to the second test data; adjusting the first phase shift on the basis of a comparison of the estimated first received data and the first test data.

In another embodiment of the present invention there is a method of adjusting a first phase shift applied to a clock signal used to detect received data from a received signal, the method comprising: transmitting a first test signal representing first test data from a sending device to a receiving device via a first data line and transmitting second test signals representing the second test data from the sending device to the receiving device via second data lines; receiving the first test signal at the receiving device thereby obtaining a first received signal and receiving the second test signals at the receiving device thereby obtaining second received signals; detecting first received data from the first received signal using a clock signal with a first phase shift applied to the clock signal and detecting second received data from the second received signals using the clock signal with second phase shifts applied to the clock signal; calculating an error detection code from the first test data or from the first and second test data and transmitting the error detection code from the sending device to the receiving device; calculating estimated first test data from the error detection code, wherein the estimated first test data are calculated under the assumption that the second test data are identical to the second received data; adjusting the first phase shift on the basis of the comparison of the first received data and the estimated first test data.

In still another embodiment of the present invention there is a microelectronic device comprising: a first data signal driver configured to transmit a first data signal representing first data to a receiving device connected to the microelectronic device via first data signal lines; second data signal drivers configured to transmit second data signals representing second data to the receiving device via second data signal lines; an error detecting code signal receiver with an input and an output, wherein the input is configured to receive an error detecting code signal from the receiving device; an inverse redundancy check calculating circuit with an input and an output, wherein the input is connected to the output of the error detecting code signal receiver, and wherein the inverse redundancy check calculating circuit is configured to calculate estimated first received data as an estimate for first received data detected by the memory device from a first received signal; a phase shift adjusting circuit with a first input and a second input and a control output, wherein the first input is connected to the output of the inverse redundancy check calculating circuit to receive the estimated first received data, and wherein the second input is configured to receive the first data; and a phase shifting circuit shifting a phase of the first data signal relative to a clock signal, wherein the phase shifting circuit comprises a control input connected to the control output of the phase shift adjusting circuit, and wherein the phase shift is a function of a signal received from the phase shift adjusting circuit via the control input.

In still another embodiment of the present invention there is a microelectronic device comprising: a first data signal receiver configured to receive a first data signal from a transmitting device connected to the microelectronic device via first data signal lines; second data signal receivers configured to receive second data signals from the transmitting device via second data signal lines; a redundancy check calculating circuit with an input receiving first and second received data, the redundancy check calculating circuit calculating an error detection code from the first and second received data; a masking device controllably masking the second received data, wherein the masking device is connected between the second data signal receivers and the redundancy check calculating circuit.

BRIEF DESCRIPTION OF THE DRAWINGS

These above recited features of the present invention will become clear from the following description, taken in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

DETAILED DESCRIPTION OF THE PREFERRED EMBODIMENT

Figure 1:
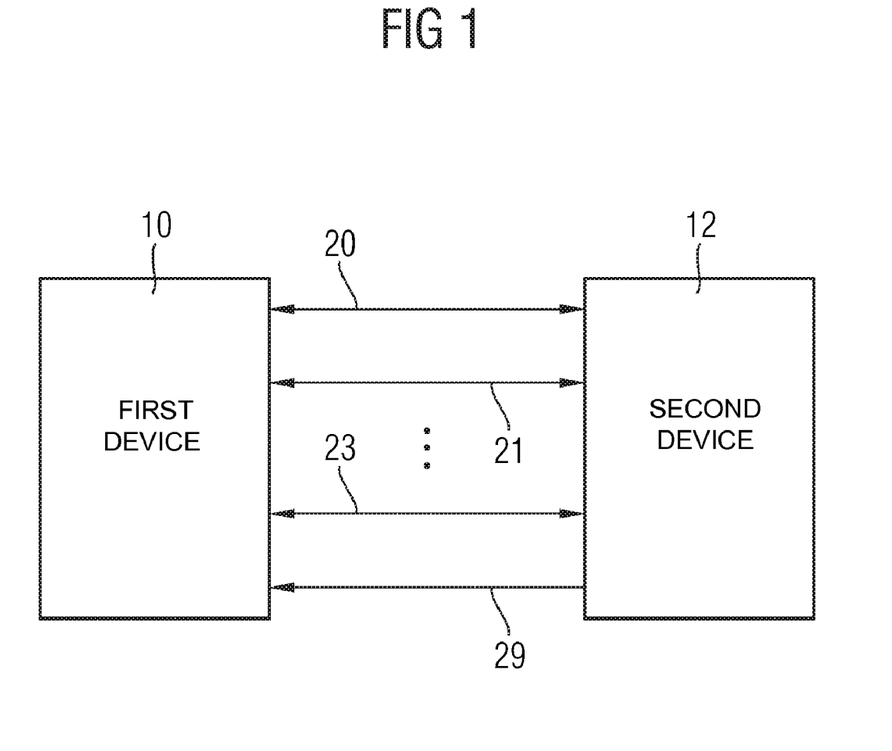
FIG. 1 shows a schematic circuit diagram of a first device and a second device according to an embodiment of the present invention.

FIG. 1 is a schematic flow chart of a first device 10 and a second device 12 wherein both the first and the second devices 10, 12 are preferably microelectronic devices like memory controllers or memory devices. The first and second devices 10, 12 are connected to each other via a plurality of data signal lines 20, 21, 23 and an error detecting code signal line 29. The data signal lines 20, 21, 23 are configured to transmit data signals from the first device 10 to the second device 12 and/or from the second device 12 to the first device 10. The error detecting code signal line is configured to transmit an error detecting code signal from the second device 12 to the first device 10. The first and second devices 10, 12 may be connected to each other via a number of further data, address, command or other signal lines which are not displayed in FIG. 1. In particular, the first and second devices 10, 12 are preferably connected via a clock signal line transmitting a clock signal from the first device 10 to the second device 12 and/or from the second device 12 to the first device 10.

The first and second devices 10, 12 are configured to transmit and receive data signals via the data signal lines 20, 21, 23 and to detect received data from received data signals, wherein each data signal is transmitted with a respective phase shift in respect to a clock signal, and wherein received data are detected from each of the received data signals with respect to a respective phase shift applied to a clock signal. Due to the characteristics of the signal paths between the first and second devices 10, 12, each transmitted signal is received with a certain delay. The delay on each signal path is a characteristic of this signal path. In order to compensate the specific delay on each signal path, at each data signal line 20, 21, 23, the respective phase shift between a sent data signal is set to an optimum value and/or a respective phase shift applied to a clock signal at detecting data from a data signal is set to an optimum value, wherein the optimum value provides a minimum error rate at detection of the received data from the received signal.

In the subsequent discussion, the first device 10 is a sending device sending data signals via the data signal lines 20, 21, 23, and the second device 12 is a receiving device receiving data signals via the data signal lines 20, 21, 23. A clock signal is provided by the first device 10 or by the second device 12 or by a third device not displayed in FIG. 1. The clock signal is provided to the first device 10 and to the second device 12.

The first device 10 sends data signals with respective phase shifts between the data signals and the clock signal. The phase shifts are individually set to optimum values for each data signal line 20, 21, 23 as described below with respect to FIG. 4. In particular, in order to adjust a first phase shift between a first data signal transmitted via the first data signal line 20 and the clock signal, first test data and second test data are provided. A first test signal representing the first test data is transmitted from the first device 10 to the second device 12 via the first data signal line 20. Second test signals representing the second test data are transmitted from the first device 10 to the second device 12 via second data signal lines 21, 23. The first test signal is received as a first received signal at the second device 12. First received data are detected from the first received signal using the clock signal. The second test signals are received as second received signals. Second received data are detected from the second received signal using the clock signal. An error detection code is calculated from the first received data or from the first received data and the second received data and transmitted from the second device 12 to the first device 10 via the error detecting code line 29.

Throughout this application, the term error detection code identifies any error detecting code appropriate for identifying errors in a redundancy check, for example in a cyclic redundancy check. In a cyclic redundancy check, an error detecting code is calculated from the received data and compared to an error detecting code calculated from the transmitted data.

In the first device 10, estimated first received data are calculated from the error detection code under the assumption that the second received data are identical to the second test data. This assumption is justified in so far as the second test signals are transmitted from the first device with optimum or near optimum second phase shifts relative to the clock signal. These optimum or near optimum phase shifts ensure that the second received data are detected from the second received signals with an extremely low or even zero error rate.

The estimated first received data are compared to the first test data, and the first phase shift is adjusted on the basis of this comparison. This adjustment of the first phase shift may be conducted in several ways. One way is to repeat the above described steps of providing first and second test data, transmitting the test signals representing the test data, receiving the test signals, detecting received data from the test signals, calculating an error detection code from the received data and calculating estimated first received data from the error detection code for a number of different values of the first phase shift. The number of errors i.e. the number of differences between the first received data and the first test data is determined for each value of the first phase shift. An interval of values of the first phase shift is determined in which no errors occur. The first phase shift is adjusted to the centre of this interval or to any other appropriate value within this interval.

Another way of adjusting the first phase shift utilizes a kind of Alexander type phase detector wherein the first test data are identified with centre of eye data and the estimated first received data are identified with crossing data. For example, the first bit of the estimated first received data is identified with the crossing between center of the first eye (identified with the first bit of the first test data) and the second eye (identified with the second bit of the first test data). In this case, there is a late event if bit number x of estimated first received data is different from bit number x of the first test data, and there is an early event if bit number x of the estimated first received data is different from bit number x+1 of the first test data. The steps of providing test data, transmitting test signals representing the test data, receiving the test signals, detecting data from the received signals, calculating the error detection code from the received data and calculating estimated first received data from the error detection code are repeated and the first phase shift is adjusted until the number of early events equals the number of late events or until the difference between the number of early events and the number of late events lies within a (small) predetermined interval around zero. The value of the first phase shift obtained in this way is a transition value. Finally, the first phase shift is set to the transition value plus one half of a symbol length or to the transition value plus any other appropriate predetermined value.

Procedures of calculating estimated first received data from the error detection code will be described below with reference to FIG. 2. These procedures can be applied to the embodiment described with respect to FIG. 1 as well.

Still referring to FIG. 1, the adjustment of a first phase shift for a transmission of data signals from the second device 12 to the first device 10 is described. First test data and second test data are provided at the second device 12. A first test signal representing the first test data is transmitted from the second device 12 to the first device 10 via the first data signal line 20. Second test signals representing the second test data are transmitted from the second device 12 to the first device 10 via the second data lines 21, 23. The first test signal is received at the first device 10 thereby obtaining a first received signal, and the second test signals are received at the first device 10 thereby obtaining second received signals. The first and second test signals are generated at the second device 12 with a predetermined phase relation to the clock signal as it is provided at the second device 12. Using the clock signal as it is provided to the first device 10 and with a first phase shift applied to this clock signal, first received data are detected from the first received signal at the first device 10. Second received data are detected from the second received signals using the clock signal as it is provided at the first device 10 with second phase shifts applied to this clock signal. An error detection code is calculated from the first test data and the second test data at the second device 12 and transmitted to the first device 10 via the error detecting code line 29. In the first device 10, estimated first test data are calculated from the error detection code received via the error detecting code line 29 and from the second received data under the assumption that the second received data are identical to the second test data. This assumption is justified in so far as the second phase shifts are set to optimum or near optimum values providing a minimum or even zero error rate in the detection of the second received data.

The first phase shift is adjusted on the basis of a comparison of the first received data and the estimated first test data. This adjustment of the first phase shift is performed similarly as described above with reference to the transmission of data from the first device 10 to the second device 12.

The adjustment of the phase shift between a first data signal and a clock signal at the sending first device 10 has been described, and the adjustment of a phase shift applied to a clock signal used for a detecting first received data at the receiving second device 12 has been described. In both cases, the adjustment refers to the transmission and reception of the signal via the first data signal line 20. However, the same procedures can be applied to phase shifts applied to a transmission or reception of data signals via one of the other data signal lines 21, 23.

Figures 2, 2A:
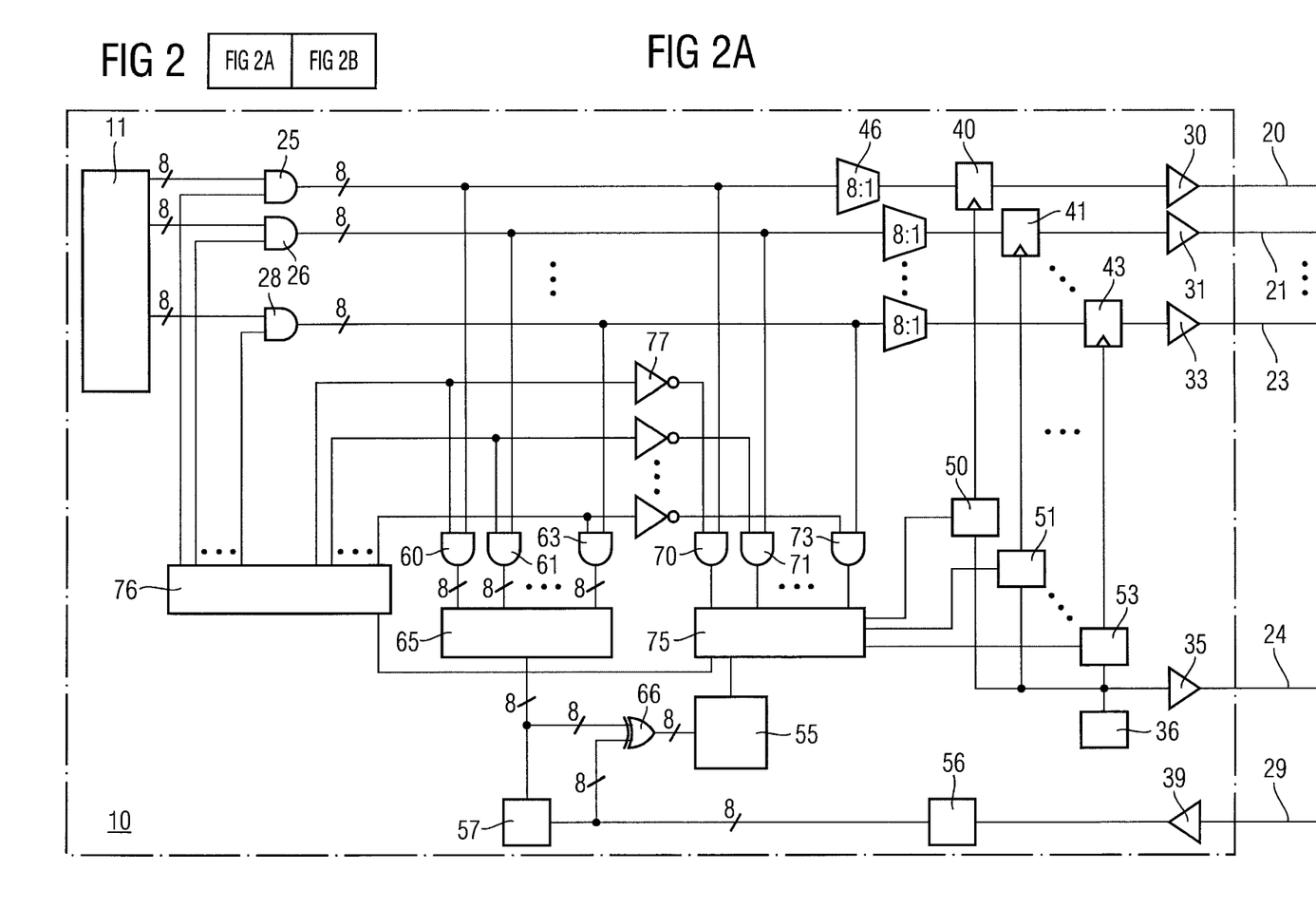
FIG. 2 shows a schematic circuit diagram of a memory controller and a memory device according to another embodiment of the present invention.
Figure 2B:
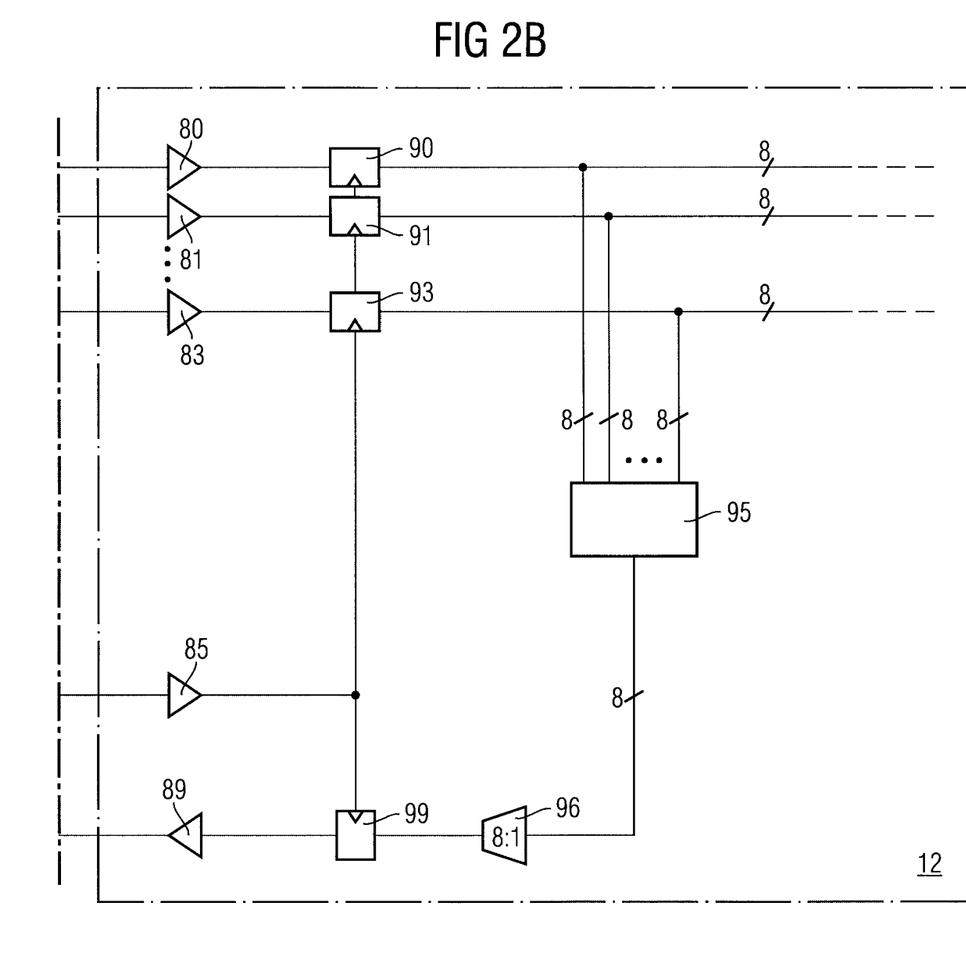

FIG. 2 is a schematic circuit diagram of a memory controller 10 and a memory device 12 according to a second embodiment of the present invention. The memory controller 10 comprises a plurality of data signal drivers 30, 31, 33, each providing an input and an output. The output of each of the plurality of data signal drivers 30, 31, 33 is connected to one of the plurality of data signal lines 20, 21, 23 connecting the memory controller 10 to the memory device 12. The input of each of the plurality of data signal drivers is connected to an output of one of a plurality of sampling circuits 40, 41, 43. An input of each of the plurality of sampling circuits 40, 41, 43 is connected to an output of one of a plurality of multiplexers 46. An input of each of the plurality of multiplexers 46 is connected to an output of one of a plurality of first AND gates 25, 26, 28. A first input of each of the plurality of first AND gates 25, 26, 28 is connected to a further circuit 11 schematically representing components of the memory controller 10 which are not displayed in FIG. 2 and are of lower relevance for the present invention. A second input of each of the plurality of first AND gates 25, 26, 28 is connected to one of a plurality of outputs of a finite state machine 76. A clock input of each of the plurality of sampling circuits 40, 41, 43 is connected to an output of one of a plurality of phase shifting circuits 50, 51, 53. An input of each of the plurality of phase shifting circuits 50, 51, 53 is connected to an output of a clock signal source 36. An input of a clock signal driver 35 is connected to the output of the clock signal source 36. An output of the clock signal driver 35 is connected to a clock signal line 24 connecting the memory controller 10 and the memory device 12.

An input of an error detecting code signal receiver 39 is connected to an error detecting code signal line 29 connecting the memory controller 10 and the memory device 12. An output of the error detecting code signal receiver 39 is connected to an input of a clock and data recovery circuit 56. An output of the clock and data recovery circuit 56 is connected to a first input of a cyclic redundancy check circuit 57 and to one input of a XOR gate 66. The output of each of a plurality of second AND gates 60, 61, 63 is connected to one of a plurality of inputs of a redundancy check calculating circuit 65. A first input of each of the plurality of second AND gates 60, 61, 63 is connected to on of the plurality of outputs of the finite state machine 76 and to an input of one of a plurality of inverters 77. A second input of each of the plurality of second AND gates 60, 61, 63 is connected to the output of one of the plurality of first AND gates 25, 26, 28. An output of the redundancy check calculating circuit 65 is connected to a second input of the cyclic redundancy check circuit 57 and to a second input of the XOR gate 66. An output of each of a plurality of third AND gates 70, 71, 73 is connected to one of a first plurality of inputs of a phase shift adjusting circuit 75. A first input of each of the plurality of third AND gates 70, 71, 73 is connected to an output of one of the plurality of inverters 77. A second input of each of the plurality of third AND gates 70, 71, 73 is connected to the output of one of the plurality of first AND gates 25, 26, 28 and to the input of one of the plurality of multiplexers 46.

An input of an inverse redundancy check calculating circuit 55 is connected to an output of the XOR gate 66. An output of the inverse redundancy check calculating circuit 55 is connected to an input of the phase shift adjusting circuit 75. A control output of the finite state machine 76 is connected to a control input of the phase shift adjusting circuit 75. A control input of each of the plurality of phase shifting circuits 50, 51, 53 is connected to a respective one of a plurality of control outputs of the phase shift adjusting circuit 75.

The memory device 12 comprises a plurality of data signal receivers 80, 81, 83. An output of each of the plurality of data signal receivers 80, 81, 83 is connected to one of the plurality of data signal lines 20, 21, 23. An output of each of the plurality of data signal receivers 80, 81, 83 is connected to an input of one of a plurality of first sampling circuits 90, 91, 93. An output of each of the plurality of sampling circuits 90, 91, 93 is connected to a respective one of a plurality of inputs of a redundancy check calculating circuit 95 and to further circuits of the memory device 12 which are of lower relevance for the present invention and are hence not displayed in FIG. 2.

An input of a clock signal receiver 85 is connected to the clock signal line 24 connecting the memory controller 10 and the memory device 12. An output of the clock signal receiver 85 is connected to a control input of each of the plurality of sampling circuits 90, 91, 93. An output of the redundancy check calculating circuit 95 is connected to an input of a multiplexer 96. An output of the multiplexer 96 is connected to an input of a second sampling circuit 99. An output of the second sampling circuit 99 is connected to an input of an error detecting code signal driver 89. An output of the error detecting code signal driver 89 is connected to the error detecting code signal line 29 connecting the memory controller 10 and the memory device 12. A control input of the sampling circuit 99 is connected to the output of the clock signal receiver 85.

As can be seen from FIG. 2, each output of the further circuit 11 is connected to one input of one of the plurality of first AND gates 25 by eight parallel lines, the output of each of the first plurality of AND gates 25, 26, 28 is connected to the input of the corresponding one of the plurality of multiplexers 46 and to one input of the corresponding one of the plurality of second AND gates 60, 61, 63 and to one input of the corresponding one of the plurality of third AND gates 70, 71, 73 via eight parallel lines. The output of each of the plurality of second AND gates 60, 61, 63 is connected to the corresponding one of the plurality of inputs of the redundancy check calculating circuit 65 via eight parallel lines. The output of each of the plurality of third AND gates 70, 71, 73 is connected to the corresponding one of the plurality of inputs of the phase shift adjusting circuit 75 via eight parallel lines. The output of the clock and data recovery circuit 56 is connected to the first input of the cyclic redundancy check circuit 57 and to one of the inputs of the XOR gate 66 via eight parallel lines. The output of the redundancy check calculating circuit 65 is connected to the second input of the cyclic redundancy check circuit 57 and to the second input of the XOR gate 66 via eight parallel lines. The output of the XOR gate 66 is connected to the input of the inverse redundancy check calculating circuit 55 via eight parallel lines. Accordingly the multiplexers 46 are 8:1 multiplexers, and the sampling circuits 40, 41, 43 provide a 1:8 de-multiplexing function, in the embodiment described with reference to FIG. 2.

It is obvious that all those connections via respective eight parallel lines can be replaced by connections via different numbers (for example 2, 4, 16, 32) of respective parallel lines when the inputs and outputs of the respective components of the memory controller 10 are adapted accordingly and the multiplexing and de-multiplexing ratios are adapted as well.

The output of each of the plurality of sampling circuits 90, 91, 93 is connected to a respective one of the plurality of inputs of the redundancy check calculating circuit 95 and to further circuits not displayed in FIG. 2 via eight parallel lines. The output of the redundancy check calculating circuit 95 is connected to the input of the multiplexer 96 via eight parallel lines. Accordingly the multiplexer 96 is a 8:1 multiplexer, and the sampling circuits 90, 91, 93 provide a 1:8 de-multiplexing function, in the embodiment described with reference to FIG. 2.

It is obvious that all those connections via respective eight parallel lines can be replaced by connections via different numbers (for example 4, 16, 32) of respective parallel lines when the inputs and outputs of the respective components of the memory device 12 are adapted accordingly.

The first, second and third AND gates 25, 26, 28, 60, 61, 63, 70, 71, 73 allow a masking of data signals transmitted from the further circuit 11 to the multiplexers 46, to the redundancy check calculating circuit 65 and to the phase shift adjusting circuit 75. This masking is controlled by the finite state machine 76. The finite state machine 76 and the second AND gates 60, 61, 63 form a masking device, and the finite state machine 76 and the third AND gates 70, 71, 73 form a masking device. Masked bits provide a logical "0".

As an alternative, a plurality of OR gates is provided instead of the first AND gates 25, 26, 28. As a further alternative, the second and/or the third AND gates are replaced by OR gates. In case of OR gates, masked bits provide a logical "1".

In a normal operating mode of the memory controller 10, the finite state machine 76 provides a logical "1" to each of the plurality of first AND gates 25, 26, 28. Therefore, data transferred from the further circuit 11 to the multiplexers 46 are not masked. The cyclic redundancy check circuit 57 compares the error detection code calculated from the sent data and the error detection code received from the memory device 12. When these error detection code are not identical an error is detected and the data needs to be sent again.

In a training mode of the memory controller 10, one of the plurality of first AND gates 25, 26, 28 receives a logical "1" from the finite state machine 76 and the other first AND gates 25, 26, 28 receive a "0" thereby masking the respective data. In the same way, the second and third AND gates 60, 61, 63, 70, 71, 73 mask the data received by the redundancy check calculating circuit 65 and the phase shift adjusting circuit 75, wherein masking is controlled by the finite state machine 76.

In a training mode of the memory controller 10 for adjusting the phase shift of a data signal transmitted from the memory controller 10 to the memory device 12 via the first data signal line 20, the finite state machine 76 sends a logical "1" to the first AND gate 25 and a logical "0" to each of the first AND gates 26, 28, a logical "0" to the second AND gate 60, a logical "1" to each of the second AND gates 60, 63, a logical "1" to the third AND gate 70 and a logical "0" to each of the third AND gates 71, 73.

Thus first test data provided by the further circuit 11 are transmitted to the phase shift adjusting circuit 75 and are transmitted to the memory device 12 via the sampling circuit 40, the data signal driver 30 and the data signal line 20 and are received by the data signal receiver 80 thereby obtaining a first received signal. First received data are detected from the first received signal by the sampling circuit 90 controlled by a memory device internal clock signal provided by the output of the clock signal receiver 85.

Due to the masking by the first AND gates 26, 28, second test data transmitted to the sampling circuits 41, 43 via corresponding multiplexers 46 merely comprise logical "0". Therefore, second test signals representing the second test data and transmitted to the memory device 12 via second signal lines 21, 23 are constant. These second test signals are received by the data signal receivers 81, 83 thereby obtaining second received signals. The second received data are detected from the second received signals by the sampling circuits 91, 93 controlled by the memory device internal clock signal.

The error detection code is calculated from the first and second received data by the redundancy check calculating circuit 95. This error detection code is transferred to the sampling circuit 99 via the multiplexer 96. Controlled by the memory device internal clock signal, an error detection code signal is generated by the sampling circuit 99 and transmitted to the clock and data recovery circuit 56 of the memory controller via the error detecting code signal driver 89, the error detecting code signal line 29 and the error detecting code signal receiver 39. The error detection code is recovered from the error detection code signal by the clock and data recovery circuit 56 and provided to the XOR gate 66 (and to the cyclic redundancy check circuit 57 which is not relevant in the training mode of the memory controller 10).

The redundancy check calculating circuit 65 receives the second test data via the second AND gates 61, 63, calculates a further error detection code and outputs this error detection code to the input of the XOR gate 66. Furthermore, the redundancy check calculating circuit 65 comprises a delay circuit delaying the test data or the further error detection code by a predetermined delay time.

Both the error detection code received from the memory device 12 and the further error detection code calculated by the redundancy check calculating circuit 65 are provided to the XOR gate 66 the output of which is provided to the inverse redundancy check calculating circuit 55.

The operation of the inverse redundancy check calculating circuit 55 is now described. Both in the redundancy check calculating circuit 55 of the memory controller 10 and in the redundancy check calculating circuit 95 of the memory device 12, the error detection code $\vec{c}$ comprising m bits is calculated from data $$\vec{d} = \begin{pmatrix} \vec{d}_j \\ \vec{d}_r \end{pmatrix}$$

comprising p bits received at the plurality of inputs of the respective redundancy check calculating circuit 65 or 95, respectively, according to the equation $$\vec{c} = T \cdot \vec{d} + \vec{a} = (T_j, T_r) \cdot \begin{pmatrix} \vec{d}_j \\ \vec{d}_r \end{pmatrix} + \vec{a} = T_j \cdot \vec{d}_j + T_r \cdot \vec{d}_r + \vec{a},$$

wherein $T=(T_j,T_r)$ is a matrix with p columns and m rows, $T_j$ is a matrix with m columns and m rows which can be inverted, $T_r$ is a matrix with p-m columns and m rows, $\vec{a}$ is a constant vector with m components, the first test data $\vec{d}_j$ comprises m bits, and the second test data $\vec{d}_r$ comprises p-m bits. This equation can be resolved for the first test data $\vec{d}_j$, $\vec{d}_j = T_j^{-1} \cdot (\vec{c} - \vec{a} - T_r \cdot \vec{d}_r)$, if $T_j$ can be inverted, wherein $T_j^{-1}$ is the inverse of $T_j (T_j^{-1} \cdot T_j = E$ with the components $$E_{xy} = \delta_{xy} = \begin{cases} 0; & x \neq y \\ 1; & x = y \end{cases}$$

of the unit matrix E). This means that estimated first received data $\vec{d}_j{}^*$ can be calculated from the error detection code $\vec{c}$ and the second received data $\vec{d}_{i \neq j}$ according to the equation $$\vec{d}_j^* = T_j^{-1} \cdot \left( \vec{c} - \vec{a} - \sum_{\substack{i=0 \\ i \neq j}}^{n-1} T_i \cdot \vec{d} \right),$$

if the second received data $\vec{d}_r$ is known. In the present example, the second test data $\vec{d}_r$ is a set of logical "0". Therefore, the second test signals are constant and no errors can occur in detecting the second test data from the second test signal in the memory device 12. Therefore, the second received data are identical to the second test data.

In the memory controller 10 according to the second embodiment, the second test data $\vec{d}_r$ are provided to the redundancy check calculating circuit 65 via the second AND gates 61, 63. The multiplication of the second test data $\vec{d}_r$ with the matrix $T_r$ is performed by the redundancy check calculating circuit 65. The constant vector $\vec{a}$ is zero. The difference term $\vec{c} - \vec{a} - T_r \cdot \vec{d}_r = \vec{c} - T_r \cdot \vec{d}_r$ is realized by the XOR gate 66 (in binary logic addition and subtraction are equivalent to an XORing of the inputs), and the multiplication with the inverse $T_j^{-1}$ of $T_j$ is realized by the inverse redundancy check calculating circuit 55. This means that the output of the inverse redundancy check calculating circuit 55 is the estimated first received data $\vec{d}_j{}^*$.

This estimated first received data $\vec{d}_j{}^*$ is compared to the first test data $\vec{d}_j$ by the phase shift adjusting circuit 75. Since the estimated first received data $\vec{d}_j{}^*$ arrive at the phase shift adjusting circuit 75 with a delay, the phase shift adjusting circuit 75 comprises a delay circuit delaying the test data by a predetermined delay time. On the basis of the comparison, the phase shift adjusting circuit 75 adjusts the phase shift applied to the clock signal from the clock signal source 36 by the phase shifting circuit 50. This comparing and adjusting procedure is preferably conducted as described above with reference to FIG. 1. The matrix $T_j^{-1}$ and hence the calculation conducted in the inverse redundancy check calculating circuit 55 can be different for the training of the phase shifts of different phase shifting circuits 50, 51, 53.

In case of the received data $$\vec{d} = \begin{pmatrix} \vec{d}_0 \\ \vdots \\ \vec{d}_{n-1} \end{pmatrix}$$

comprising n·m bits (each $\vec{d}_i$ (i=0, ..., n-1) comprising m bits and being transmitted via one of the data signal lines 20, 21, 23), the matrix T can be written as $T=(T_0, T_1, \ldots, T_{n-1})$ with $T_i$ (i=0, ..., n-1) being matrices with m columns and m rows which can be inverted. In this case, the error detection code is calculated according to the equation $$\vec{c} = T \cdot \vec{d} + \vec{a} = \sum_{\substack{i=0 \\ i \neq j}}^{n-1} T_i \cdot \vec{d}_i + \vec{a},$$

the estimated first received data $\vec{d}_j^*$ is calculated from the error detection code $\vec{c}$ and the second test data $\vec{d}_{i \neq j}$ according to the equation $$\vec{d}_j^* = T_j^{-1} \cdot \left( \vec{c} - \vec{a} - \sum_{\substack{i=0 \\ i \neq j}}^{n-1} T_i \cdot \vec{d} \right),$$

$T_j^{-1}$ being the inverse of $T_j$.

As can be easily seen, in the above described training mode for the first phase shift applied by the phase shifting circuit 50, all the data received by the redundancy check calculating circuits 65 are masked either by the first AND gates 26, 28 or by the second AND gate 60. Therefore, the redundancy check calculating circuit 65 always and exclusively receive logical "0" at all its inputs in this training mode. The same is true for equivalent training modes for adjusting the phase shift values of the phase shifting circuits 51, 53. Therefore, the circuitry of the memory controller 10 could be simplified for this training mode, in particular the XOR gate 66 could be eliminated. (The redundancy check calculating circuit 65 is required for a normal operation mode of the memory controller 10 anyway.)

However, the above described training mode is only one possible training mode. Although the above described training mode provides the best security that the second received data input to the redundancy check calculating circuit 95 of the memory device 12 are identical to the second test data provided in the memory controller 10 to the redundancy check calculating circuit 65, the fulfillment of this requirement can be presumed within other cases, too. In particular when the phase shift values applied to the second test signals are already set to optimum or near optimum values, this requirement is fulfilled. Therefore, in an alternative training mode of the memory controller 10, the finite state machine 76 controls the second AND gates 60, 61, 63 in such a way that they do not mask any data.

Preferably the first described training mode is applied during a setup procedure of the memory controller 10 and the memory device 12 and the alternative training mode is used later on repeatedly during short interruptions of the normal operation mode of the memory controller 10 and the memory device 12 for a smooth tracking of the phase shift values.

When there is no first guess for the first phase shift (for example at the beginning of a setup procedure of the memory controller 10 and the memory device 12), the preferred first test data provides a bit pattern like 00001111 or 11110000 with only one transition from 0 to 1 or from 1 to 0. This bit pattern provides a high probability that the transition from 0 to 1 or from 1 to 0 is found and the phase shift is adjusted correctly.

For a more precise adjustment of the first phase shift, the first test data is then changed to a bit pattern like 00110011 or 01010101. In order to further improve the precision of adjustment, more elaborated bit patterns can be used providing an extremely early rising edge (for example 11110111), an extremely late rising edge (for example 00001000), an extremely early falling edge (for example 00001000) or an extremely late falling edge (for example 11110111). Alternatively, random bit patterns are used.

These bit patterns for the first test data may be combined with elaborated bit patterns in the second test data in the above described alternative training mode. For example, the same bit pattern or a bit pattern with opposite transitions can be provided on aggressor lines (adjacent lines) thereby incorporating the influence of adjacent data signal lines. This provision of elaborated bit patterns in the second test data requires that the alternative training mode is conducted.

Figure 3:
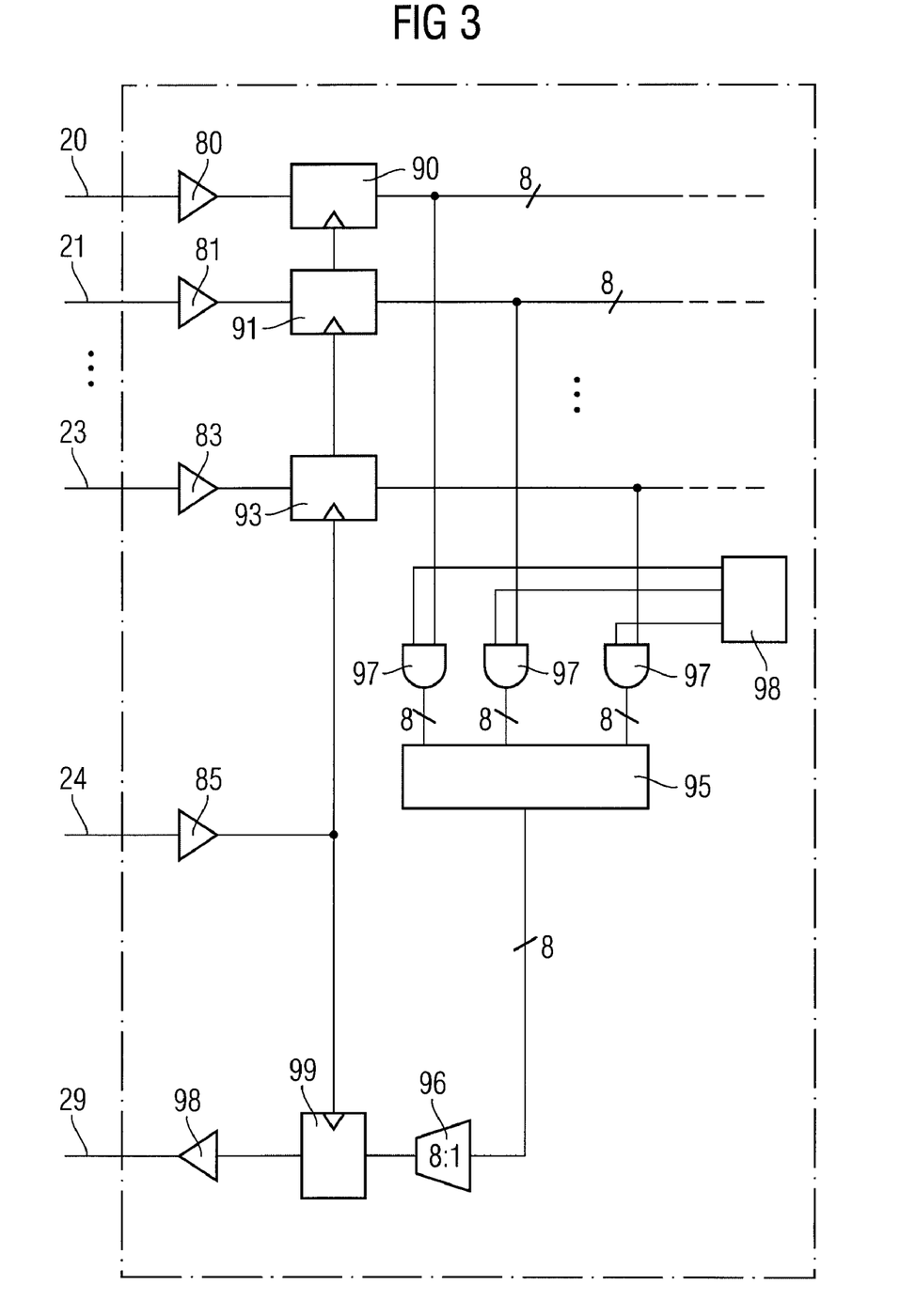
FIG. 3 shows a schematic circuit diagram of a memory device according to a further embodiment of the present invention.

In order to combine the advantages of both the first and second training modes, in a third training mode no masking takes place at the first AND gates 25, 26, 28 but the second received data are masked at the inputs of the redundancy check calculating circuit 95 of the memory device 12. FIG. 3 displays a memory device differing from the memory device described above with reference to FIG. 2 in that a plurality of AND gates 97 and a control circuit 98 are provided for selectively masking the received data provided to the inputs of the redundancy check calculating circuit 95. The AND gates 97 and the control circuit 98 together form a masking device. Masked bits provide a logical "0".

As an alternative, a plurality of OR gates is provided instead of the AND gates 97. In this case, masked bits provide a logical "1".

Figure 4:
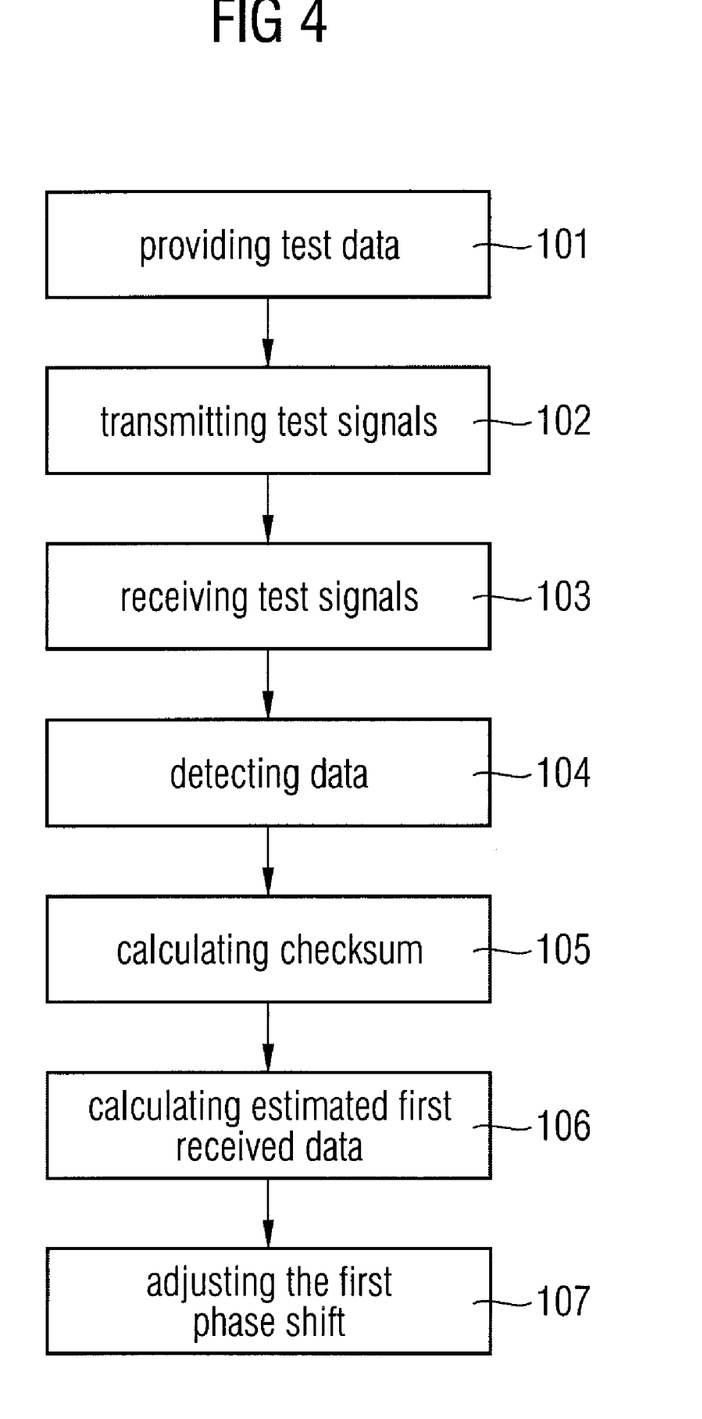
FIG. 4 shows a schematic flow chart of a method according to a further embodiment of the present invention.

FIG. 4 is a schematic flow chart of a method according to the present invention. In a first step 101, first test data and second test data are provided. In a second step 102, a first test signal representing the first test data is transmitted from a sending device 10 to a receiving device via a first data line and second test signals representing the second test data are transmitted from the sending device to the receiving device via second data lines wherein there is a first phase shift between the first test signal and a clock signal and wherein there are second phase shifts between the second test signals and the clock signal. In a third step 103, the first test signal is received at the receiving device thereby obtaining a first received signal, and the second test signals are received at the receiving device thereby obtaining second received signals. In a fourth step 104, first received data are detected from the first received signal and second received data are detected from the second received signal using a clock signal. In a fifth step 105, the error detection code is calculated is from the first received data or from the first and second received data and transmitted from the receiving device to the sending device. In a sixth step 106, estimated first received data are calculated from the error detection code under the assumption that the second received data are identical to the second test data. In a seventh step 107, the first phase shift is adjusted on the basis of a comparison of the estimated first received data and the first test data. Various modifications and variance of this method have been described above.

The preceding description only describes advantageous exemplary embodiments of the invention. The features disclosed therein and the claims and their drawings can, therefore be essential for the realization of the invention in its various embodiments, both individually and in any combination. While the foregoing is directed to embodiments of the present invention, other and further embodiments of this invention may be devised without departing from the basic scope of the invention, the scope of the present invention being determined by the claims that follow. As far as steps of a method are numbered, this numbers do not indicate a predetermined order or sequence of the steps.

What is claimed is:

1. A method of adjusting a first phase shift between a data signal and a clock signal at a sending device, the method comprising:
   a) transmitting a first test signal representing first test data from the sending device to a receiving device via a first data line and transmitting second test signals representing second test data from the sending device to the receiving device via second data lines, wherein the first phase shift exists between the first test signal and the clock signal, and wherein second phase shifts exists between the second test signals and the clock signal;
   b) receiving the first test signal and the second test signals at the receiving device;
   c) detecting first received data from the first received signal and second received data from the second received signals using a clock signal;
   d) calculating an error detection code from one of the first received data and the first and second received data, and transmitting the error detection code from the receiving device to the sending device;
   e) calculating estimated first received data from the error detection code, wherein the estimated first received data are calculated under the assumption that the second received data are identical to the second test data; and
   f) adjusting the first phase shift on the basis of a comparison of the estimated first received data and the first test data.

2. The method according to claim 1, wherein the sending device is a memory controller, the receiving device is a memory device, the clock signal is generated at the memory controller and transmitted to the memory device, and the error detection code is calculated at the memory device and transmitted to the memory controller.

3. The method according to claim 1, wherein all bits of the second test data provide one predetermined value.

4. The method according to claim 1, wherein the error detection code is calculated solely from the first received data.

5. The method according to claim 1, wherein the error detection code is calculated from the first received data and masked second received data by means of a normal mode error detection code algorithm which is also used in a normal operation mode of the memory controller and the memory device, wherein the masked second received data are a predetermined bit pattern irrespective of the second received data.

6. The method according to claim 5, wherein each bit of the predetermined bit pattern is a "0" or wherein each bit of the predetermined bit pattern is a "1".

7. The method according to claim 1, wherein the step e) further comprises: determining a first number being the number of bits of the estimated first received data which are equal to the corresponding bit of the first test data; and determining a second number being the number of bits of the first received data which are different from the corresponding bit of the first test data, and the method further comprising:
   repeating the steps a) through e) with a modified value of the first phase shift;
   determining a transition value of the first phase shift, wherein the transition value of the first phase shift causes a minimum difference between the first number and the second number; and
   setting the first phase shift to the transition value plus a predetermined value.

8. The method according to claim 7, wherein the predetermined value is one half of a symbol length.

9. The method according to claim 7, wherein the steps a) through e) are repeated for a predetermined number of times and/or until the difference between the first number and the second number is within a predetermined interval.

10. The method according to claim 1, wherein the step f) comprises:
    conducting the steps a) through e) for a plurality of different values of the first phase shift;
    determining an interval of values of the first phase shift in which the estimated first received data are identical to the first test data; and
    setting the first phase shift to a value within the interval.

11. The method according to claim 10, wherein the step of setting the first phase shift comprises setting the first phase shift to a value in the center of the interval.

12. The method according to claim 1, wherein the error detection code $\vec{c}$ comprising m bits is calculated from received data $$\vec{d} = \begin{pmatrix} \vec{d}_j \\ \vec{d}_r \end{pmatrix}$$

comprising p bits according to the equation $$\vec{c} = T \cdot \vec{d} + \vec{a} = (T_j, T_r) \cdot \begin{pmatrix} \vec{d}_j \\ \vec{d}_r \end{pmatrix} + \vec{a} = T_j \cdot \vec{d}_j + T_r \cdot \vec{d}_r + \vec{a},$$

$T=(T_j, T_r)$ being a matrix with p columns and m rows, $T_j$ being a matrix with m columns and m rows which can be inverted, $T_r$ being a matrix with p−m columns and m rows, $\vec{a}$ being a constant vector with m components, the first test data $\vec{d}_j$, comprising m bits, the second test data $\vec{d}_r$ comprising p−m bits, and wherein the estimated first received data $\vec{d}_j{}^*$ is calculated from the error detection code $\vec{c}$ and the second test data $\vec{d}_r$ according to the equation $\vec{d}^*{}_j = T_j^{-1} \cdot (\vec{c} - \vec{a} - T_r \cdot \vec{d}_r)$, $T_j^{-1}$ being the inverse of $T_j$.

13. The method according to claim 1, wherein the error detection code $\vec{c}$ comprising m bits is calculated from received data $$\vec{d} = \begin{pmatrix} \vec{d}_0 \\ \vdots \\ \vec{d}_{n-1} \end{pmatrix}$$

comprising n·m bits according to the equation $$\vec{c} = T \cdot \vec{d} + \vec{a} = \sum_{\substack{i=0 \\ i \ne j}}^{n-1} T_i \cdot \vec{d}_i + \vec{a},$$

$T=(T_0, T_1, \ldots, T_{n-1})$ being a matrix with n·m columns and m rows, $T_i$ (i=0, ..., n−1) being matrices with m columns and m rows which can be inverted, $\vec{a}$ being a constant vector with m components, $\vec{d}_i$ (i=0, ..., n−1) comprising m bits, and wherein the estimated first received data $\vec{d}_j^*$ is calculated from the error detection code $\vec{c}$ and the second test data $\vec{d}_{i \ne j}$ according to the equation $$\vec{d}_j^* = T_j^{-1} \cdot \left( \vec{c} - \vec{a} - \sum_{\substack{i=0 \\ i \ne j}}^{n-1} T_i \cdot \vec{d} \right),$$

$T_j^{-1}$ being the inverse of $T_j$.

* * * * *